United States Patent [19]

Correll

[11] Patent Number: 5,680,569
[45] Date of Patent: Oct. 21, 1997

[54] CACHE COLUMN TIMING CONTROL

[75] Inventor: Jeffrey A. Correll, Austin, Tex.

[73] Assignee: Advanced Micro Devices, Inc., Sunnyvale, Calif.

[21] Appl. No.: 531,490

[22] Filed: Sep. 21, 1995

Related U.S. Application Data

[63] Continuation of Ser. No. 296,058, Aug. 24, 1994, abandoned.

[51] Int. Cl.$^6$ .................................................. G06F 12/00
[52] U.S. Cl. .................. 395/427; 395/800; 395/426; 365/189.01; 365/191; 365/195; 365/196; 365/203; 365/207; 365/210
[58] Field of Search .............................. 395/800, 427, 395/428; 365/191, 195, 196, 189.01, 203, 207, 210

[56] References Cited

U.S. PATENT DOCUMENTS

| | | | |
|---|---|---|---|
| 3,942,160 | 3/1976 | Yu | 340/173 |
| 4,622,655 | 11/1986 | Suzuki | 365/119 |
| 4,627,032 | 12/1986 | Kolwicz et al. | 365/203 |
| 4,736,288 | 4/1988 | Shintani et al. | 364/200 |
| 4,751,681 | 6/1988 | Hashimoto | 365/207 |
| 4,807,115 | 2/1989 | Torng | 364/200 |
| 4,866,677 | 9/1989 | Sakurai | 365/222 |
| 4,899,275 | 2/1990 | Sachs et al. | 364/200 |
| 4,943,948 | 7/1990 | Morton et al. | 365/201 |
| 5,136,697 | 8/1992 | Johnson | 395/375 |
| 5,226,126 | 7/1993 | McFarland et al. | 395/375 |
| 5,226,139 | 7/1993 | Fujishima | 395/425 |
| 5,226,147 | 7/1993 | Fujishima | 395/425 |
| 5,241,497 | 8/1993 | Komarek | 365/104 |
| 5,253,203 | 10/1993 | Partovi et al. | 365/189.05 |
| 5,267,198 | 11/1993 | Hatano et al. | 365/189.01 |
| 5,268,869 | 12/1993 | Ferris et al. | 365/210 |
| 5,329,489 | 7/1994 | Diefentorff | 365/189.05 |
| 5,353,427 | 10/1994 | Fujishima et al. | 395/425 |
| 5,359,566 | 10/1994 | Furuyama | 365/149 |
| 5,383,160 | 1/1995 | Furuyama | 365/221 |
| 5,418,750 | 5/1995 | Shiratake et al. | 365/206 |
| 5,453,954 | 9/1995 | Nakamura | 365/201 |
| 5,479,374 | 12/1995 | Kobayashi et al. | 365/233.5 |

OTHER PUBLICATIONS

Mike Johnson, Superscalar Microprocessor Design, Memory Dataflow, ©1991, pp.147–163.

Primary Examiner—Jack B. Harvey
Assistant Examiner—Valerie Darbe
Attorney, Agent, or Firm—Skjerven, Morrill, MacPherson, Franklin & Friel L.L.P.; Stephen A. Terrile

[57] ABSTRACT

A cache which includes an integrated timing circuit through which the cache control passes thus allowing the timing of the storage circuit of the cache core to be adjusted.

16 Claims, 4 Drawing Sheets

CACHE COLUMN TIMING CONTROL

CROSS-REFERENCE TO RELATED APPLICATION

This application is a continuation of application Ser. No. 08/296,058, filed on Aug. 24, 1994, now abandoned.

BACKGROUND OF THE INVENTION

The present invention relates to microprocessors, and, more particularly, to providing microprocessors with high performance caches.

Microprocessors have attained wide-spread use throughout many industries. A goal of any microprocessor is to process information quickly. One technique which is used to increase the speed with which the microprocessor processes information is to provide the microprocessor with an architecture which includes a fast local memory called a cache.

A cache is used by the microprocessor to temporarily store instructions and data. A cache which stores both instructions and data is referred to as a unified cache; a cache which stores only instructions is an instruction cache and a cache which stores only data is a data cache. Providing a microprocessor architecture with either a unified cache or an instruction cache and a data cache is a matter of design choice.

One microprocessor architecture that has gained widespread acceptance is the X86 architecture. This architecture, first introduced in the i386™ microprocessor, is also the basic architecture of both the i486™ microprocessor and the Pentium™ microprocessor, all available from the Intel corporation of Santa Clara, Calif.. The X86 architecture provides for three distinct types of addresses, a logical (i.e., virtual) address, a linear address and a physical address.

The logical address represents an offset from a segment base address. The segment base address is accessed via a selector. More specifically, the selector, which is stored in a segment register, is an index which points to a location in a global descriptor table (GDT). The GDT location stores the linear address corresponding to the segment base address.

The translation between logical and linear addresses depends on whether the microprocessor is in Real Mode or Protected Mode. When the microprocessor is in Real Mode, then a segmentation unit shifts the selector left four bits and adds the result to the offset to form the linear address. When the microprocessor is in Protected Mode, then the segmentation unit adds the linear base address pointed to by the selector to the offset to provide the linear address.

The physical address is the address which appears on the address pins of the microprocessor and is used to physically address external memory. The physical address does not necessarily correspond to the linear address. If paging is not enabled then the 32-bit linear address corresponds to the physical address. If paging is enabled, then the linear address must be translated into the physical address. A paging unit, which is usually included as part of the microprocessor's memory management unit, performs this translation.

The paging unit uses two levels of tables to translate the linear address into a physical address. The first level table is a Page Directory and the second level table is a Page Table. The Page Directory includes a plurality of page directory entries; each entry includes the address of a Page Table and information about the Page Table. The upper 10 bits of the linear address (A22–A31) are used as an index to select a Page Directory Entry. The Page Table includes a plurality of Page Table entries; each Page Table entry includes a starting address of a page frame and statistical information about the page. Address bits A12–A21 of the linear address are used as an index to select one of the Page Table entries. The starting address of the page frame is concatenated with the lower 12 bits of the linear address to form the physical address.

Because accessing two levels of table for every memory operation substantially affects performance of the microprocessor, the memory management unit generally also includes a cache of the most recently accessed page table entries, this cache is called a translation lookaside buffer (TLB). The microprocessor only uses the paging unit when an entry is not in the TLB.

The first processor conforming to the X86 architecture which included a cache was the 486 processor, which included an 8 Kbyte unified cache. The Pentium™ processor includes separate 8 Kbyte instruction and data caches. The 486 processor cache and the Pentium™ processor caches are accessed via physical addresses; however, the functional units of these processors operate with logical addresses. Accordingly, when the functional units require access to these caches, the logical address must be converted to a linear address and then to a physical address.

In microprocessor architectures other than the X86 architecture, it is known to use virtually addressed caches to eliminate the address translation time from a cache hit. However, because input output devices (I/O) use physical addresses, mapping is required for the I/O to interact with the cache. In these systems, there are generally only two levels of addressing, virtual and physical, and thus only a single translation is required for the physically addressed I/O devices to interact with the virtually addressed cache. Additionally, with a virtually addressed cache, every time a process is switched, the virtual addresses refer to different physical addresses, and thus, the cache must be flushed as the virtually addressed cache entries are potentially invalid. Additionally, with a virtually addressed cache, it is possible for two different virtual addresses to correspond to the same physical address. These duplicate addresses are called aliases and could result in two locations in a virtual cache having information from the same physical address, the information in only one of the locations being modified.

It is known to use buffer chains to delay the read until a suitable voltage differential is available to the sense amplifier of the cache. These buffer chains have no relation to any of the bit cells of the cache and therefore if the process of manufacturing the cache varies, the changes due to the process do not affect the timing delay in the same way as it affected the performance of the bit cells during a read cycle.

SUMMARY OF THE INVENTION

It has been discovered that providing a cache core with an integrated timing circuit through which the cache control passes advantageously allows the timing of the storage circuit of the cache core to be adjusted as well as closely relating the performance of a cache access to the activation of the sense amplifier of the cache.

DETAILED DESCRIPTION OF THE INVENTION

The following sets forth a detailed description of the best contemplated mode for carrying out the invention. The description is intended to be illustrative of the invention and should not be taken to be limiting.

Figure 1:
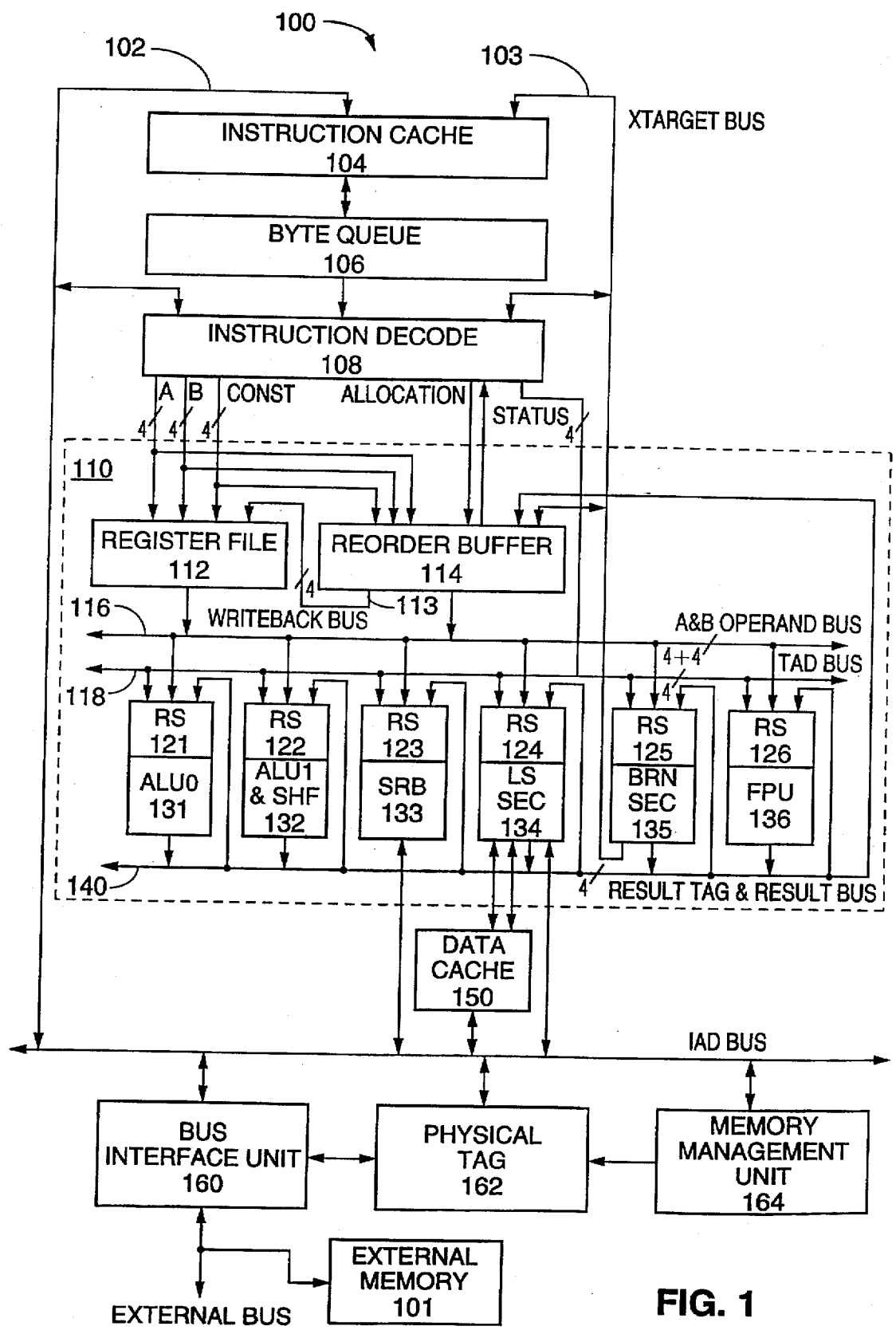
FIG. 1 is a block diagram of a microprocessor in accordance with the present invention.

Referring to FIG. 1, the present invention can be best understood in the context of superscalar X86 microprocessor 100 which executes the X86 instruction set. Microprocessor is coupled to physically addressed external memory 101 via a 486 XL bus or other conventional microprocessor bus. Microprocessor 100 includes instruction cache 104 which is coupled to internal address and data (IAD) bus 102 and XTARGET bus 103 as well as to byte queue 106 which is coupled to instruction decoder 108. Instruction decoder 108 is coupled to RISC core 110. RISC core 110 includes register file 112 and reorder buffer 114 as well as a variety of functional units such as arithmetic logic unit 131 (ALU0), arithmetic logic and shift unit 132 (ALU1 & SHF), special register block 133 (SRB), load/store functional unit 134 (LSSEC), branch section 135 (BRNSEC), and floating point unit 136 (FPU).

RISC core 110 includes A and B operand buses 116, type and dispatch (TAD) bus 118 and result tag and result bus 140 which are coupled to the functional units. A and B operand buses 116 are also coupled to register file 112 and reorder buffer 114. TAD bus 118 is also coupled to instruction decoder 108. Result bus 140 is also coupled to reorder buffer 114. Additionally, branch section 135 is coupled to reorder buffer 114, instruction decoder 108 and instruction cache 104 via Xtarget bus 103.

In addition to instruction cache 104, microprocessor 100 also includes data cache 150 (DCACHE) and physical tag circuit 162. Data cache 150 is coupled to Load/store functional unit 134 of the RISC core and with IAD bus 102. Physical tag circuit 162 interacts with both instruction cache 104 and data cache 150 via IAD bus 102. Instruction cache 104 and data cache 150 are both linearly addressable caches. Instruction cache 104 and data cache 150 are physically separate, however, both caches are organized using the same architecture, i.e., both caches include a store array along with a corresponding tag array.

Microprocessor 100 also includes memory management unit (MMU) 164 and bus interface unit 160 (BIU). Memory management unit 164 is coupled with IAD bus 102 and physical tag circuit 162. Bus interface unit 160 is coupled to physical tag circuit 162 and IAD bus 102 as well as an external microprocessor bus such as the 486 XL bus.

Microprocessor 100 executes computer programs which include sequences of instructions. Computer programs are typically stored on a hard disk, floppy disk or other nonvolatile storage media which are located in the computer system. When the program is run, the program is loaded from the storage media into main memory 101 which is accessed by microprocessor 100 via bus interface unit 160. Once the instructions of the program and associated data are in main memory 101, individual instructions are prepared for execution and ultimately executed by microprocessor 100.

After being stored in main memory 101, the instructions are passed via bus interface unit 160 to instruction cache 104, where the instructions are temporarily held. Instruction decoder 108 receives the instructions from instruction cache 104 via byte queue 106, which aligns and buffers the instructions. Instruction decoder 108 examines the instructions and determines the appropriate action to take. For example, decoder 108 may determine whether a particular instruction is a PUSH, POP, LOAD, AND, OR, EX OR, ADD, SUB, NOP, JUMP, JUMP on condition (BRANCH) or other instruction. Depending on which particular instruction that decoder 108 determines is present, the instruction is dispatched to the appropriate functional unit of RISC core 110.

The instructions which are dispatched to RISC core 110 typically include multiple fields in the following format: OP CODE, OPERAND A, OPERAND B, DESTINATION REGISTER. For example, the instruction ADD A, B, C means add the contents of register A to the contents of register B and place the result in register C.

The OP CODEs are provided from instruction decoder 108 to the functional units of RISC core 110 via type and dispatch (TAD) bus 118. Not only must the OP CODE for a particular instruction be provided to the appropriate functional unit, but also the designated OPERANDs for the instruction must be retrieved and sent to the functional unit. If the value of a particular operand is stored in main memory 101, then this value is retrieved and stored in data cache 150. This value may then be loaded by load store section 134 to be provided to reorder buffer 114. Alternately, if the value of a particular operand has not yet been calculated, then that value must be first calculated and provided to the functional unit before the functional unit can be executed. For example, if a current instruction is dependent on a prior instruction, the result of the prior instruction must be determined before the current instruction can be executed. This situation is referred to as a dependency.

The operands which are needed for a particular instruction to be executed by a functional unit are provided by either register file 112 or reorder buffer 114 to the operand bus. The operand bus conveys the operands to the appropriate functional units. Once a functional unit receives the OP CODE, OPERAND A, and OPERAND B, the functional unit executes the instruction and places the result on a result bus 140, which is coupled to the outputs of all of the functional units and to reorder buffer 114.

Reorder buffer 114 is managed as a first in first out (FIFO) device. When an instruction is decoded by instruction decoder 108, a corresponding entry is allocated in reorder buffer 114. The result value computed by the instruction is then written into the allocated entry when the execution of the instruction is completed. The result value is subsequently written into register file 112 and the instruction retired if there are no exceptions associated with the instruction and if no speculative branch is pending which affects the instruction. If the instruction is not complete when its associated entry reaches the head of the reorder buffer 114, the advancement of reorder buffer 114 is halted until the instruction is completed. Additional entries, however, can continue to be allocated.

Each functional unit includes respective reservation stations (RS) 121-126 for storing OP CODEs from instructions which are not yet complete because operands for that instruction are not yet available to the functional unit. Each reservation station stores the instruction's OP CODE together with tags which reserve places for the missing operands that will arrive at the reservation station later. This technique enhances performance by permitting microprocessor 100 to continue executing other instructions while the pending instruction is being assembled with its operands at the reservation station.

Microprocessor 100 affords out of order issue by isolating decoder 108 from the functional units of RISC core 110. More specifically, reorder buffer 114 and the reservation stations of the functional units effectively establish a distributed instruction window. Accordingly, decoder 108 can continue to decode instructions even if the instructions can not be immediately executed. The instruction window acts as a pool of instructions from which the functional units draw as they continue to go forward and execute instructions. The instruction window thus provides microprocessor 100 with a look ahead capability. When dependencies are cleared and as operands become available, more instructions in the window are executed by the functional units and the decoder continues to fill the window with yet more decoded instructions.

Microprocessor 100 uses branch section 135 of the RISC core to enhance its performance. Because when a branch occurs, the next instruction depends upon the result of the branch, branches in the instruction stream of a program hinder the capability of the microprocessor to fetch instructions. Accordingly, predicted branches, which are predicted using information which is stored in a successor array of instruction cache 104, are executed by branch section 135. Branch section 135 then examines the results of the branch to determine whether the predicted branch was correct. If there is an exception or branch misprediction, then the contents of reorder buffer 114 allocated subsequent to the mispredicted branch instruction are discarded.

Figure 2:
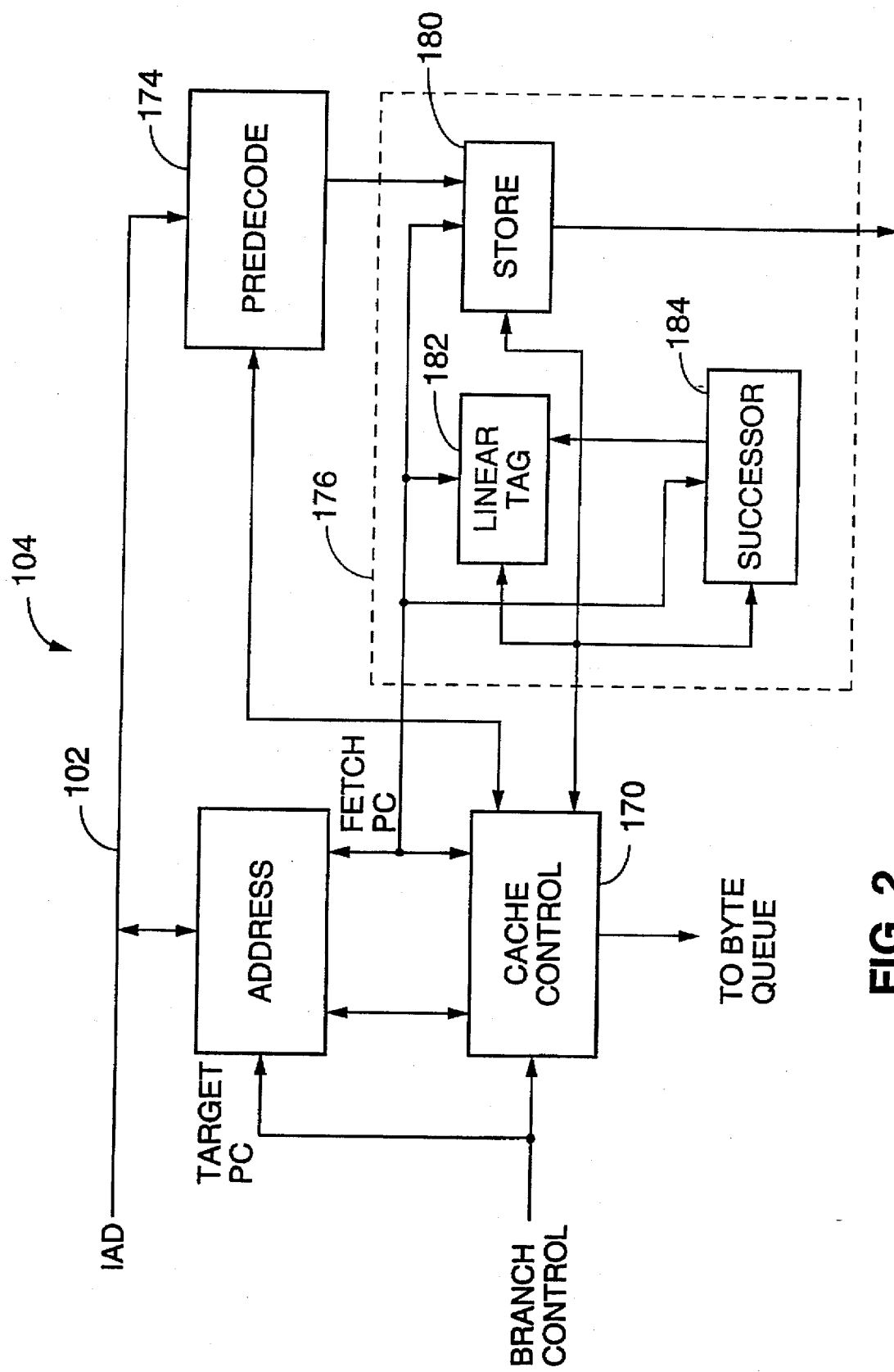
FIG. 2 is a block diagram of a linearly addressed instruction cache in accordance with the present invention.

Referring to FIG. 2, a description of instruction cache 104 with reference to the present invention is presented; the application Ser. No. 08/146,381 entitled "Linearly Addressable Microprocessor Cache", which is incorporated by reference, sets forth the structure and operation of instruction cache 104 in greater detail. Instruction cache 104 is a linearly addressed 16 Kbyte 4-way set associative cache. Each set includes 256 entries; each entry includes a sixteen byte instruction block, a linear address tag and next predicted executed branch information. Instruction cache 104 includes cache controller 170, address circuit 172, predecode circuit 174 and cache array 176. Cache controller 170 provides control signals to orchestrate the various operations of instruction cache 104. Address circuit 172 generates a linear fetch program counter (FETCH PC) based upon a logical target program counter which is received from branch section 135; address circuit 172 also provides address generation and X86 protection checking associated with pre-fetching instructions from external memory. Address circuit 172 functions as a translation circuit for translating between logical addresses and linear addresses. Predecode circuit 174 receives pre-fetched x86 instruction bytes via IAD bus 102, assigns predecode bits for each x86 instruction byte and writes the predecoded x86 instruction bytes into cache array 176. Cache array 176 stores instructions received from predecode circuit 174 and provides these instructions to byte queue 106 when addressed by the linear FETCH PC signal.

Cache array 176 is organized into three main arrays, instruction cache store array 180, linear tag array 182 and successor array 184. Instruction cache store array 180 stores the 16 byte instructions. Linear tag array 182 stores the linear address tags corresponding to the instructions. Successor array 184 stores predicted branch information, which is used to support branch prediction, corresponding to the instructions. Each of these arrays is addressed by the linear FETCH PC address which is provided by address circuit 172. Each of these arrays uses a similar cache array structure as described below.

Figure 3:
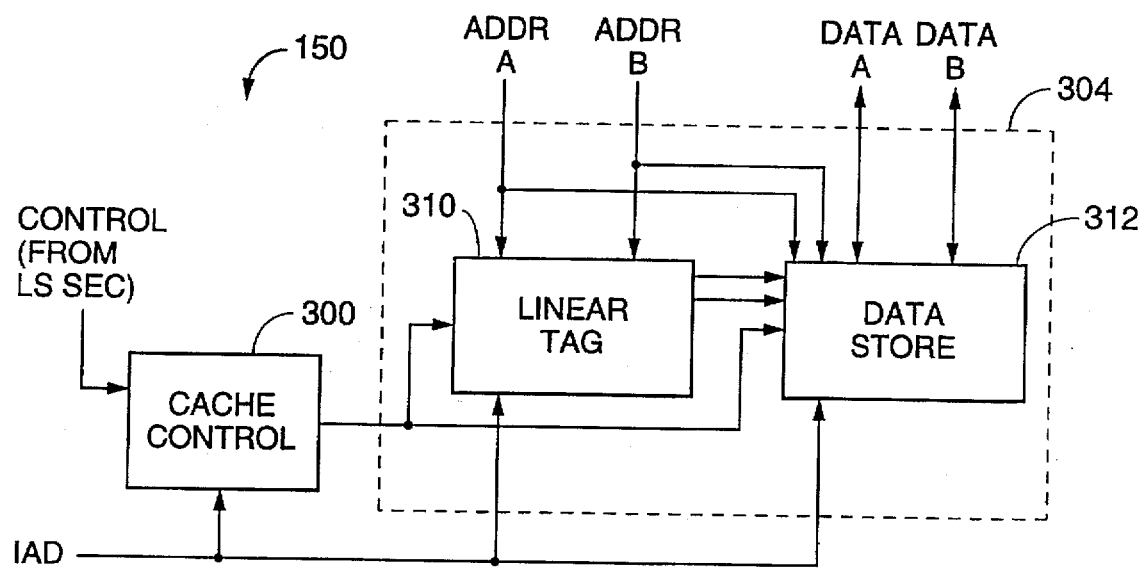
FIG. 3 is a block diagram of a linearly addressed data cache in accordance with the present invention.

Referring to FIG. 3, a description of data cache 150 with reference to the present invention is presented; the application Ser. No. 08/146,376 entitled "High Performance Load/ Store Functional Unit and Data Cache", which is incorporated by reference, sets forth the structure and operation of data cache 150 in greater detail. Data cache 150 is a linearly addressed 8 Kbyte 4-way set associative cache. Each set of data cache 150 includes 128 entries; each entry includes a sixteen byte block of information. Data cache 150 includes data cache controller 300 and data cache array 304. Data cache controller 300 provides control signals to orchestrate the various operations of data cache 104. Data cache controller 300 receives control signals (CONTROL) from load store section 134 as well as from IAD bus 102; data cache controller 300 provides control signals to cache array 304. Cache array 304 stores data in blocks and provides the blocks of data when a particular block is addressed. Data cache array 304 is also coupled with IAD bus 102; in addition to the control signals from cache controller 300, data cache array receives address signals and data signals from load store section 134.

Data cache array 304 is organized into two arrays, data store array 312 and data linear tag circuit 310. Each of these arrays includes a similar cache core as described below. Data cache array 312 receives and provides two data signals (DATA A, DATA B) to load/store functional unit 134. Data linear tag circuit 304 is addressed by two linear addresses (ADDR A, ADDR B) which are provided by load/store functional unit 134; the two linear addresses are also provided to data store array 312. Accordingly, data cache array 304 is a dual ported memory array, both ports being coupled with load/store functional unit 134 to allow two data values to be written or read simultaneously. Data store array 312 also receives control signals from linear tag array 310. Each of these arrays uses a similar cache array structure as described below.

Figure 4:
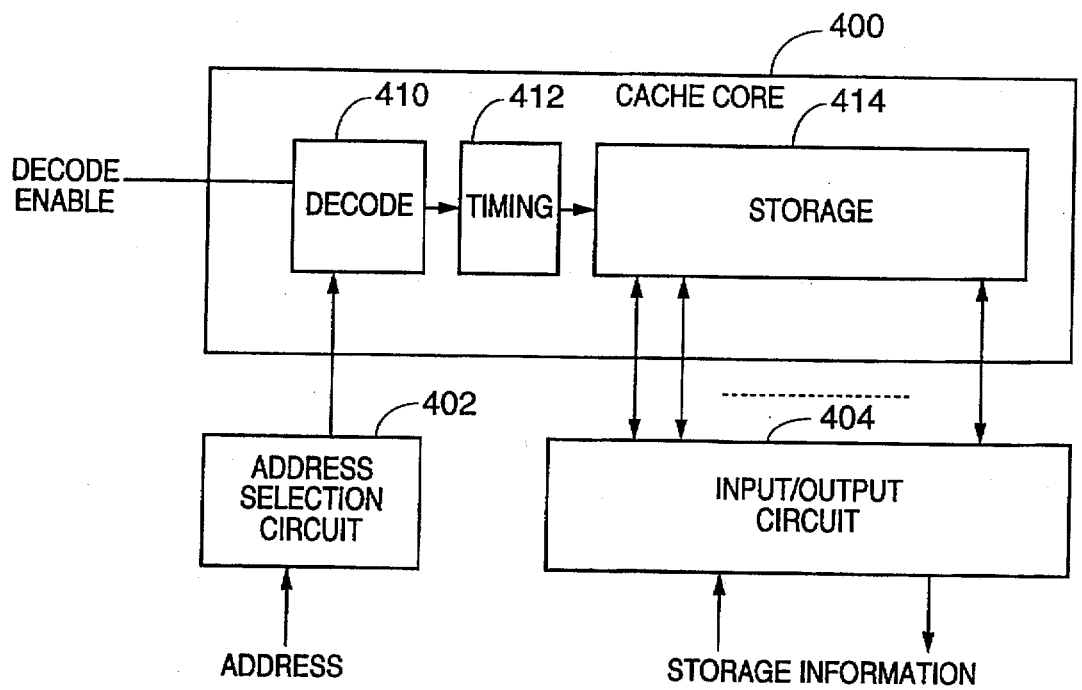
FIG. 4 is a block diagram of a cache array in accordance with the present invention.

Referring to FIG. 4, each cache array in microprocessor 100 includes cache core 400 as well as address selection circuit 402 and input/output circuit 404. Cache arrays are included within instruction cache 104 and data cache 150 as well as within physical tag circuit 162 and memory management circuit 164. Both address selection circuit 402 and input output circuit 404 are cache specific. I.e., these circuits may vary depending upon the function of the cache array. Cache core 400 includes decode circuit 410, timing circuit 412 and storage circuit 414.

Address selection circuit 402 receives two addresses and provides one of these addresses as the index for the cache. I.e., address selection circuit 402 functions as a multiplexer. Address selection circuit 402 is only used with caches which can potentially receive more than one address in one clock cycle. Address selection circuit 402 determines which address to pass based upon external criteria provided by the cache controller.

Input/output circuit 404 provides a variety of functions based upon the function of the cache. E.g., input/output circuit 404 is used in multi-way caches to select which set is to be passed as the input or output. For example, in data cache 150, the tag hit from linear tag 310 is passed to store array 312 to control which set is passed. In the various tag arrays, input/output circuit 404 actually performs the tag compare.

Cache core 400 is the portion of the cache where the actual information is stored and the function relating to the information store is performed. Decode circuit 410 functions as a bit wise decoder that is enabled by the decode enable signal. The decode enable signal allows one of the lines within the array to turn on. Thus allowing bit cells to write and read. Timing circuit 412 provides the correct delay time between when a row is accessed and when the sense amp of the cache core can read the voltage differential of a particular bit cell. The correct time is the time required to build a suitable voltage differential, which may vary based upon such things as the process or the feature size. Storage circuit 414 includes a matrix of bit cells in which all the bits in a row are simultaneously enabled. Thus, only one bit per column is enabled. Then the columns are sensed to determine the data in the array.

Figure 5:
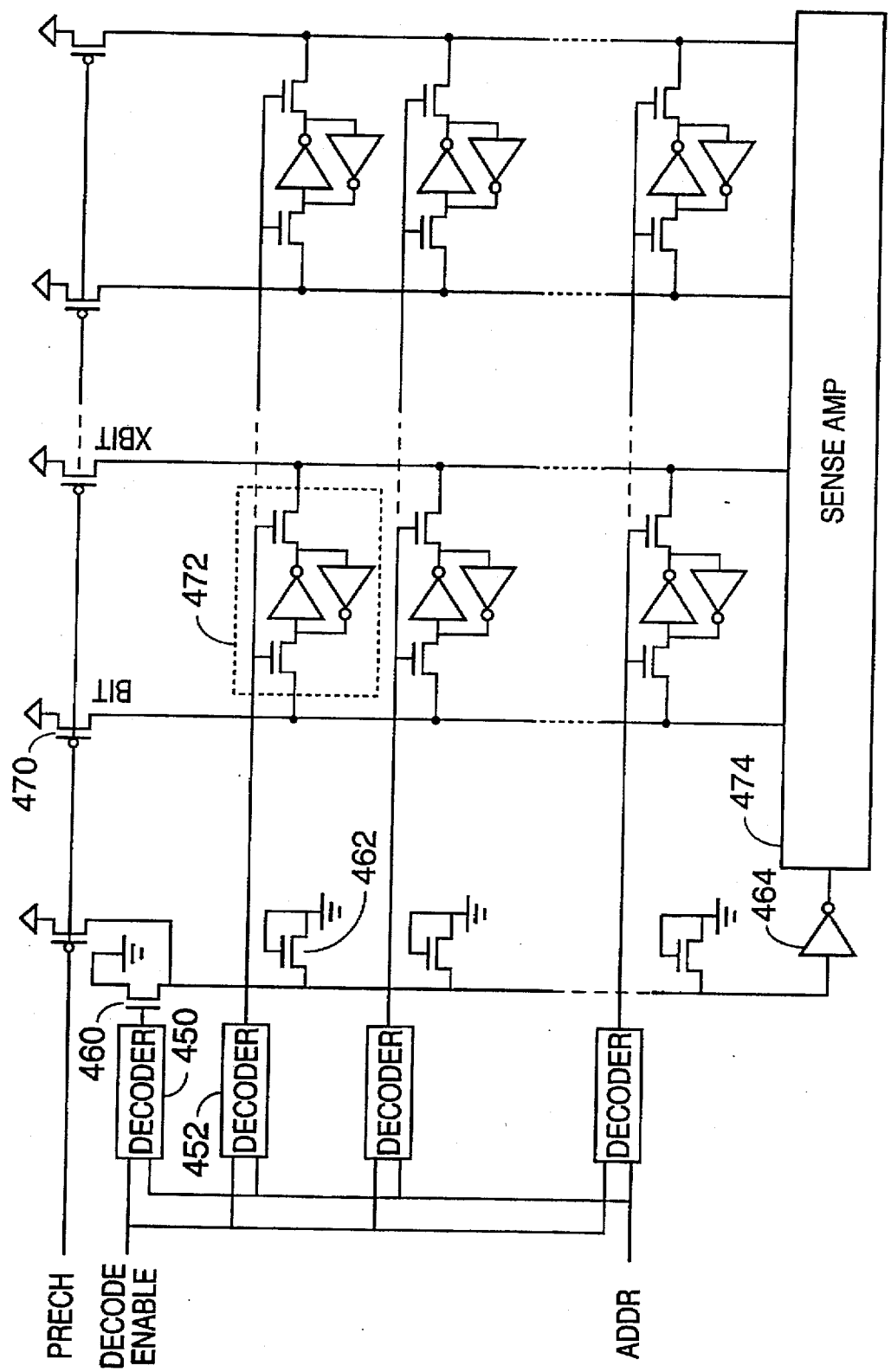
FIG. 5 is a block diagram of a cache core in accordance with the present invention.

Referring to FIG. 5. decode circuit 410, timing circuit 412 and storage circuit 414 of cache core 400, are shown in more detail. Decode circuit 410 includes a plurality of row decode circuits 452 as well as sense enable decoder circuit 450. Timing circuit 412 includes timing discharge transistor 460, timing transistors 462 and inverter 464. Storage circuit 414 includes a plurality of column precharge transistors 470, which correspond to each bit line of storage circuit 414, a plurality of bit cells 472, which correspond to each storage location in storage circuit 414 and sense amp 474, which receives the differential output signals from each column of bit cells 472.

Sense enable decoder circuit 450 receives the decode enable signal, which indicates a storage access, as an input. The other inputs to sense enable decoder 450 are active, thus causing sense enable decoder circuit 450 to be activated when the decode enable signal is active. Sense enable decoder circuit 450 provides a timing enable signal to timing discharge transistor 460.

Each row decode circuit 452 receives the decode enable signal an input. Additionally, each row decode circuit 452 receives the address signal which is provided by address selection circuit 402. When the decode enable signal is active then the row decode circuits 452 are enabled to decode the address. Each row decode circuit 452 examines the address to determine whether the address corresponds to an address of the particular row. If the address corresponds to the address of a particular row, then the row decode circuit 452 for this row is activated, thus activating that row of bit cells. The bit and Xbit lines of the bit cells are precharged high. When the decoder activates a row of bits, the cross-coupled inverters that store the data begin to drive a low voltage through one of the N-type transistors in the storage bit cell. This action creates the voltage differential in sense amp 474.

By varying the size of timing enable transistor 460 and the size of inverter 464, the timing difference between when the decode enable signal is activated and when sense amp 474 is activated can be varied. Varying this timing difference allows the voltage which accumulates within sense amp 474 to vary. Accordingly, the timing of the core can be easily adjusted.

By providing timing transistors 462, which correspond to each row of bit cells, the timing of sense amp 474 tracks the timing of a read operation of bit cells because the line between timing discharge transistor 460 and inverter 464 looks and acts like a bit line. The number of N-type transistors that are connected to the bit columns correspond to the number of N-type transistors that are connected to timing column 412 to mimic the timing of the bit cells. Additionally, by providing these transistors, the parasitic value of the timing circuit reflects any variations in cache core 414.

The ratio of the inverter 464 determines when sense amp 474 is made to read the voltage differential between the bit and Xbit lines of the bit cells. I.e., the sensitivity to a falling edge and thus the time for voltage to accumulate in sense amp 474 is determined by the time difference between when the timing enable signal goes active and when sense amp 474 is activated.

Bit cells 472 are designed as is well known in the art to provide a bit of storage. Bits cells 472 vary depending upon the cache in which the cells reside. For example, the cells may be either synchronously or asynchronously set/reset or the cells may be either single ported or dual ported.

Other Embodiments

Other embodiments are within the following claims.
What is claimed is:
1. A memory array comprising:
a decoder portion providing a timing enable signal and a plurality of row enable signals in response to an address signal and a decode enable signal;
a plurality of bit cells organized in rows and columns and coupled to the decoder portion, each bit cell of a column coupled between complementary bit lines, respective ones of the row enable signals selecting respective rows of bit cells to supply the information stored therein onto the bit lines;
a timing circuit coupled to the decoder portion to receive the timing enable signal, the timing circuit mimicking the discharge characteristics of the bit lines and bit cells coupled thereto, the timing circuit controlling an interval between receipt of the timing enable signal and provision of a read control signal and allowing for process-related variations in the bit lines and bit cells to be reflected in the timing circuit; and
a storage read out portion coupled to the bit lines and the timing circuit, the storage read out portion reading, in response to the read control signal, information supplied on the bit lines by the selected bit cells;
wherein the timing circuit comprises a timing discharge transistor, an inverter, and a plurality of timing transistors, each timing transistor having a first current terminal coupled to ground and a second current terminal coupled along a common timing line to form a timing column mimicking the discharge characteristics of a corresponding bit line and the bit cells coupled thereto, the timing discharge transistor having a first current terminal coupled to the timing column, a second current terminal coupled to ground, and a control terminal coupled to receive the timing enable signal, the inverter having an input coupled to the bottom of the timing column and having an output coupled to the storage read out portion to supply the read control signal after the timing column has at least partially discharged.

2. The memory array of claim 1 wherein each bit cell comprises an access transistor coupled to a respective one of the bit lines, wherein the storage read out portion comprises a sense amplifier coupled to the timing circuit and to the bit lines, the sense amplifier determining in response to the read control signal the voltage differential between complementary ones of the bit lines, wherein discharge of the timing circuit controls the interval between receipt of the timing enable signal and provision of the read control signal to the sense amplifier, and wherein substantial identicality of the access transistors and corresponding ones of the timing transistors allows for process-related variations in the access transistors and bit lines to be reflected in the discharge characteristics of the timing circuit.

3. The memory array of claim 1 wherein loading and parasitic characteristics of the timing circuit mimic those of the bit lines and bit cells coupled thereto.

4. The memory array of claim 1 wherein the first current terminal of the timing discharge transistor is coupled at the top of the timing column.

5. A timing circuit for a memory array having a column of bit cells coupled between complementary bit lines, a decoder portion, and a sense amplifier coupled to the bit lines, each bit cell including an access transistor having a current terminal coupled to one of the bit lines, the timing circuit comprising:

a precharge transistor;

a plurality of timing transistors substantially similar to the access transistors, each timing transistor having a first current terminal coupled to ground and a second current terminal coupled along a common timing line to form a timing column, the top of the timing column being coupled to the precharge transistor;

a timing discharge transistor having a first current terminal coupled to the timing column, a second current terminal coupled to ground, and a control terminal for receiving an enable signal from the decoder portion; and an inverter having an input coupled to the bottom of the timing column and having an output coupled to activate the sense amplifier;

wherein the timing discharge transistor and the inverter provide control over a delay through the timing circuit, and wherein timing column allows for process-related variations in the access transistors and bit lines to be reflected in the timing circuit.

6. A timing circuit as recited in claim 5 wherein the timing column mimics the discharge characteristics of the bit lines and the access transistors coupled thereto.

7. A timing circuit as recited in claim 6 wherein loading and parasitic characteristics of the timing column mimic those of the bit lines and access transistors coupled thereto.

8. A timing circuit as recited in claim 6 wherein one of the bit lines and the access transistors coupled thereto comprise a bit column, wherein the timing transistors are substantially identical to corresponding ones of the access transistors, and wherein substantial similarity between the structure of a bit column and the timing column allows the delay between receipt of the enable signal and activation of the sense amplifier to reflect process-related variations in the bit column.

9. A timing circuit as recited in claim 6 wherein the size of the timing discharge transistor and the ratio of the inverter determine the length of the delay between receipt of the enable signal and activation of the sense amplifier to read a voltage differential between the complementary bit lines.

10. A timing circuit as recited in claim 9 wherein the delay through the timing circuit is chosen to allow for a voltage differential to develop between the complementary bit lines which is sufficient for detection by the sense amplifier.

11. A timing circuit as recited in claim 5 wherein the first current terminal of the timing discharge transistor is coupled at the top of the timing column.

12. A memory array comprising:

a plurality of bit cells coupled between a bit line and a complementary bit line, each bit cell including first and second access transistors having a first current terminal coupled to a storage circuit and a gate coupled to receive a corresponding row select signal, the first access transistor having a second current terminal coupled along the bit line to form a bit column, the second access transistor having a second current terminal coupled along the complementary bit line to form a complementary bit column, first ends of the bit column and the complementary bit column respectively coupled to first and second precharge devices, the corresponding row select signal triggering at least partial discharge of one of the bit column and the complementary bit column;

a plurality of timing transistors substantially identical to corresponding ones of the first and second access transistors, each timing transistor having a first current terminal coupled to ground and a second current terminal coupled along a common timing line to form a timing column, a first end of the timing column being coupled to a third precharge device;

a timing discharge transistor having a first current terminal coupled to the timing column, a second current terminal coupled to ground, and a control terminal for receiving a timing enable signal and triggering at least partial discharge of the timing column;

an inverter having an input coupled to a second end of the timing column and supplying a read control signal at an output; and a sense amplifier coupled to the inverter output and to second ends of the bit column and complementary bit column, the sense amplifier determining in response to the read control signal, the voltage differential between the bit line and the complementary bit line, wherein discharge of the timing circuit controls the delay between receipt of the timing enable signal and provision of the read control signal to the sense amplifier, and wherein the substantial identicality of the timing transistors and corresponding ones of the access transistors allows for process-related variations in the access transistors and bit lines to be reflected in the discharge characteristics of the timing column.

13. A timing circuit as recited in claim 12 wherein the first current terminal of the timing discharge transistor is coupled at the top of the timing column.

14. A timing circuit as recited in claim 12 wherein the bit cells comprise cross-coupled inverters.

15. A timing circuit as recited in claim 12 wherein the size of the timing discharge transistor and the ratio of the inverter determine the length of the delay between receipt of the timing enable signal and provision of the read control signal to the sense amplifier.

16. A timing circuit as recited in claim 12 wherein the delay through the timing circuit is chosen to allow for a voltage differential to develop between the bit line and the complementary bit line, wherein the voltage differential is sufficient for detection by the sense amplifier.

* * * * *